(12) United States Patent
Henriksen

(10) Patent No.: US 8,855,335 B2
(45) Date of Patent: Oct. 7, 2014

(54) DISTORTION SUPPRESSION IN HIGH-LEVEL CAPABLE AUDIO AMPLIFICATION CIRCUIT

(75) Inventor: Jens Jorgen Gaarde Henriksen, Charlottenlund (DK)

(73) Assignee: Invensense, Inc., San Jose, CA (US)

( * ) Notice: Subject to any disclaimer, the term of this patent is extended or adjusted under 35 U.S.C. 154(b) by 546 days.

(21) Appl. No.: 13/302,288

(22) Filed: Nov. 22, 2011

(65) Prior Publication Data

US 2012/0121106 A1 May 17, 2012

Related U.S. Application Data

(63) Continuation-in-part of application No. 12/795,072, filed on Jun. 7, 2010.

(60) Provisional application No. 61/186,056, filed on Jun. 11, 2009, provisional application No. 61/243,240, filed on Sep. 17, 2009, provisional application No. 61/243,221, filed on Sep. 17, 2009.

(51) Int. Cl.
| | | |
|---|---|---|
| *H03F 99/00* | (2009.01) | |
| *H03F 3/68* | (2006.01) | |
| *H04R 3/06* | (2006.01) | |
| *H03F 3/187* | (2006.01) | |
| *H03F 1/32* | (2006.01) | |
| *H03F 3/45* | (2006.01) | |
| *H03M 1/06* | (2006.01) | |
| *H03M 1/00* | (2006.01) | |
| *H04R 19/00* | (2006.01) | |
| *H04R 19/04* | (2006.01) | |
| *H03G 3/30* | (2006.01) | |

(52) U.S. Cl.
CPC ...... *H03F 3/187* (2013.01); *H03F 2203/45552* (2013.01); *H03F 3/68* (2013.01); *H03F 2200/331* (2013.01); *H04R 19/005* (2013.01); *H04R 3/06* (2013.01); *H03F 2203/45138* (2013.01); *H03F 2203/45571* (2013.01); *H03F 2203/45586* (2013.01); *H03F 1/3211* (2013.01); *H03F 3/45475* (2013.01); *H04R 19/04* (2013.01); *H03F 2200/03* (2013.01); *H04R 2499/11* (2013.01); *H03G 3/30* (2013.01)
USPC ............................ 381/120; 341/118; 341/139

(58) Field of Classification Search
USPC ..................... 381/111–115, 120, 121, 26, 28; 341/118, 139
See application file for complete search history.

(56) References Cited

U.S. PATENT DOCUMENTS

| | | | |
|---|---|---|---|
| 6,271,780 | B1 | 8/2001 | Gong et al. |
| 2010/0183167 | A1 | 7/2010 | Phelps et al. |
| 2012/0250884 | A1 | 10/2012 | Phelps et al. |

OTHER PUBLICATIONS

"Stereo ADC with Microphone Preamplifier", Wolfson Microelectronics, Production Data, Jun. 2011, Rev 4.3.

*Primary Examiner* — Ping Lee
(74) *Attorney, Agent, or Firm* — Maryam Imam; IPxLaw Group LLP

(57) ABSTRACT

The present invention relates to an audio amplification circuit comprising a first preamplifier for receipt of an audio input signal and a second preamplifier comprising a first differential input for receipt of an attenuated audio input signal. The attenuated audio input signal is generated by an attenuator coupled to the audio input signal. A non-linear element is coupled to a first input of the first preamplifier thereby distorting the audio input signal at the first input at large signal levels. A distortion compensation network is adapted to supply a distortion compensation signal from the first input of the first preamplifier to a second differential input of the second preamplifier such that distortion in the output signal of the second preamplifier is cancelled or attenuated. The invention further relates to a corresponding method of compensating an audio amplification circuit for distortion induced by a non-linear element.

30 Claims, 3 Drawing Sheets

DISTORTION SUPPRESSION IN HIGH-LEVEL CAPABLE AUDIO AMPLIFICATION CIRCUIT

CROSS-REFERENCE TO RELATED APPLICATIONS

This is a continuation-in-part of U.S. patent application Ser. No. 12/795,072 filed Jun. 7, 2012, which claims priority to provisional application 61/186,056, filed on Jun. 11, 2009, provisional application 61/243,240, filed on Sep. 17, 2009, and provisional application 61/243,221, filed on Sep. 17, 2009, each of which are incorporated herein by reference in their entirety.

The present invention relates to an audio amplification circuit comprising a first preamplifier for receipt of an audio input signal and a second preamplifier comprising a first differential input for receipt of an attenuated audio input signal. The attenuated audio input signal is generated by an attenuator coupled to the audio input signal. A non-linear element is coupled to a first input of the first preamplifier thereby distorting the audio input signal at the first input at large signal levels. A distortion compensation network is adapted to supply a distortion compensation signal from the first input of the first preamplifier to a second differential input of the second preamplifier such that distortion in the output signal of the second preamplifier is cancelled or attenuated. The invention further relates to a corresponding method of compensating an audio amplification circuit for distortion induced by a non-linear element.

BACKGROUND

Acceptable handling of audio signals with very large dynamic range presents significant challenges to audio amplification and processing circuits and systems, in particular for audio amplification and processing circuits targeted for portable devices and applications such as mobile terminals, hearing instruments, headsets, sound recording cameras etc.

Since portable devices are powered from battery sources severe constraints as to a maximum acceptable power consumption of the audio amplification circuit is typically imposed. To further worsen the situation, there typically exist similar constraints on a maximum DC supply voltage that can be provided to the audio amplification and processing circuitry. The audio amplification and processing or conditioning circuitry often comprise preamplifiers, analogue-to-digital converters, active filters, voltage supply regulators, etc. The maximum DC power supply voltage, and therefore AC signal voltage swing, will often be limited to a voltage below a maximum rated voltage of the particular semiconductor process used to implement the signal processing or conditioning circuitry on. Furthermore, a continuing trend of shrinking minimum feature sizes of active devices on semiconductor dies and circuits in general and CMOS processes in particular, leads to a constant decline of the maximum DC power supply voltage these active devices can withstand or tolerate. Audio amplification systems and circuitry, such as audio signal controllers and audio amplification circuits, which can operate on these declining DC power supply voltages without audio performance degradation, are therefore highly desirable. It is generally undesirable to reduce performance of the audio amplification system, for example by lowering dynamic range or amplification of a preamplifier, to accommodate large audio input signals despite the decrease of the DC power supply voltage. The DC power supply voltage may be less than 2 Volt or even less than 1.5 Volt. The audio amplification system should therefore be able to provide unimpaired audio quality at low level signals and at high level signals at the decreased or lowered DC power supply voltage.

An interesting application of the present audio amplification system is to amplify and digitize audio signals in miniature microphones where microphone transducer elements are capable of generating audio input signals with a very large dynamic range. The microphone transducer elements may comprise a capacitive electret or condenser transducer of a miniature ECM, that is capable of handling very high sound pressure levels and generate correspondingly large transducer signals without significant distortion. These very high sound pressure levels, for example peak sound pressure levels above 110, 120 or 130 dB SPL, can originate from different types of acoustic sources for example car door slamming, wind noise and augmented live music performances. However, prior art microphone amplification systems have not been capable of handling the entire dynamic range of these transducer signals in an entirely satisfactory manner, e.g., without increasing equivalent input noise of the miniature microphone or overloading the miniature microphone at large sound pressure levels or both.

Accordingly, there is a need in the art for microphone amplification circuits and systems capable of handling the entire dynamic range of the transducer signals generated by microphone transducer elements, or other audio source signals with large dynamic range, without excessive distortion or noise within the previously discussed constraints on DC power supply voltage and power consumption dictated by portable or battery-powered devices and applications. The present audio amplification circuit exploits a dual-preamplifier structure wherein a first preamplifier can handle signal amplification at low and normal audio input signal levels and a second preamplifier can handle signal amplification at very high audio input signal levels. A distortion compensation network is adapted to supply a distortion compensation signal from a first input of the first preamplifier to a second differential input of the second preamplifier such that distortion in the output signal of the second preamplifier is cancelled or attenuated during conditions with large levels of the audio input signal. The large level of the audio input signal may correspond to a peak sound pressure level above 110, 120 or 130 dB SPL on a microphone coupled to the audio amplification circuit.

PRIOR ART

In general, prior art microphone amplification circuits for miniature microphones have been designed to accommodate sound pressure levels up till a maximum limit around 110 dB SPL or lower where preamplifier non-linearity or clipping has limited further increase of microphone output voltage. This has been considered acceptable in view of the relatively rare occurrence of sound pressure levels above this maximum limit. To protect the microphone amplification circuit against excessively large transducer signals generated by large low-frequency sound pressures it has been practiced to introduce a high-pass filter with a corner or cut-off frequency located between for example 100 Hz and 200 Hz in the microphone amplification circuit or by introducing an acoustical high-pass filter in a microphone transducer element itself for example by means of an appropriately dimensioned hole in a diaphragm.

U.S. Pat. No. 6,271,780 describes a gain ranging A/D converter for microphone applications having two separate gain paths provided as a low-gain path and a high-gain path each including a preamplifier coupled to an analogue-to-digital converter to provide respective digital signals. The gain of the first and second preamplifiers differs with 24 dB. The gain ranging A/D converter furthermore comprises summing device performing a mixing or blending operation on the respective digital signals supplied by the low and high-gain paths. A proportionality device controls an amount of gain applied to each of the digital signals to be summed from the low and high-gain paths in accordance with a summing profile. The amount of gain of each of the digital signals to be summed is determined by comparing a level of the digital signal of the high-gain path to upper and lower pre-set thresholds.

The WM8737L Product Sheet describes a low power stereo audio ADC for portable applications. The left and right signal channels have separate microphone signal inputs and each signal channel comprises a gain programmable microphone preamplifier operatively coupled to an analogue-to-digital converter through a programmable gain amplifier (PGA). The gain of each PGA is logarithmically adjustable from −97 dB to +30 dB in 0.5 dB steps by writing appropriate values to a PGA gain control register. The stereo audio ADC comprises a zero-cross detector for each channel to, in one mode of operation, only change respective gains of the programmable microphone preamplifier and the PGA when the input signal of a channel is at zero.

SUMMARY

According to a first aspect of invention there is provided an audio amplification circuit comprising:
   an input terminal for receipt of an audio input signal,
   an attenuator coupled to the input terminal for providing an attenuated audio input signal at an attenuator output,
   a first preamplifier comprising a first input operatively coupled to the input terminal for receipt of the audio input signal,
   a non-linear element coupled to the first input of the first preamplifier distorting the audio input signal at large levels,
   a second preamplifier comprising first and second differential inputs wherein a first differential input is operatively coupled to the attenuator output for receipt of the attenuated audio input signal and the second differential input is coupled to a feedback network,
   a distortion compensation network adapted to supply a distortion compensation signal from the first input of the first preamplifier to the second differential input of the second preamplifier such that distortion in the output signal of the second preamplifier is cancelled or attenuated.

The attenuator is operative to create an advantageous difference between the overload limits of the first and second preamplifiers if the preamplifiers have substantially identical overload points in terms of maximum output voltage swing. The attenuator preferably comprises a resistive or capacitive voltage divider. By an appropriate design of the attenuator the level of the attenuated audio input signal applied to the second differential input of the second preamplifier is significantly reduced compared to the audio signal level at the input terminal. This leads to a beneficial shielding of input transistors or other active devices of the second preamplifier from peak audio signal voltages rising above or below DC power supply voltage rails of the second preamplifier. It is furthermore advantageous if the attenuator comprises a voltage divider formed by passive components such as a resistive or capacitive voltage divider since passive components are far better suited than active semiconductor devices, such as CMOS transistors, to handle very large levels of audio signal voltages in a linear manner. The application of an attenuator based on a capacitive voltage divider is very useful in condenser microphone applications, for example miniature ECM applications, because the substantially capacitive load presented by the capacitive voltage divider to a capacitive or condenser transducer element of the condenser microphone leads to a substantially frequency independent attenuation of a transducer signal. Furthermore, capacitors of the capacitive voltage do not contribute with thermal noise to the audio input signal in contrast to a resistor based attenuator, in particular a high impedance attenuator required by the extremely large generator impedance of a condenser transducer element of a miniature ECM. In addition, appropriate capacitor values of the capacitors of the capacitive voltage divider can be formed on the integrated semiconductor substrate with minimal die area consumption and therefore at a low cost. In one embodiment, the capacitive voltage divider comprises first and second cascaded capacitors coupled in-between the input terminal and a signal ground node such as circuit ground or a DC supply or DC reference voltage. A midpoint node between the first and second cascaded capacitors forms an attenuator output which is operatively coupled to the first differential input of the second preamplifier. The first and second capacitors values may for example be selected to be around 100 fF and 900 fF, respectively, to provide approximately 20 dB of attenuation of the audio input signal at the first differential input of the second preamplifier. The cascade of the first and second capacitors cooperates to introduce a capacitive load of around 90 fF on the input terminal.

As mentioned above, the attenuator protects the second differential input of the second preamplifier from being subjected to very large audio input signal levels such that the second preamplifier may operate substantially linearly even at these large audio signal levels. The latter levels may correspond to sound pressure levels above 110 or 120 dB SPL depending on the sensitivity of a microphone transducer coupled to the input terminal.

A first signal channel comprising the first preamplifier can often be considered a normal sensitivity channel which is well-adapted to amplify or process low levels and normal levels of the audio input signal without introducing unacceptable noise at small or zero audio input signal levels. Normal levels of the audio input signal may correspond to sound pressure levels between 60 and 120 dB SPL on a miniature condenser microphone coupled to the input terminal of the audio amplification circuit. A second signal channel comprising the second preamplifier may be adapted to handling audio input signals at levels for example 10 dB or 20 dB larger than the first signal channel before the second signal channel reaches its overload or clipping limit.

Some embodiments of the present audio amplification circuit may comprise one or more additional preamplifiers and signal channels for example a third signal channel providing a third amplified audio signal with a signal amplification in-between the first and second signal amplifications. Even though the input terminal may be adapted for receipt of analogue audio input signals originating from various types of audio sources or generators such as recorded music and speech signals provided as line level signals, the present amplification circuit is particularly well-suited to amplify signals originating directly from a capacitive transducer element. The capacitive transducer element may comprise a microphone transducer element directly coupled to the input terminal. The microphone transducer element may comprise a condenser microphone, e.g. a micro-electromechanical (MEMS) condenser microphone, e.g. shaped and sized for mobile terminal applications. Other examples of microphone transducer elements are capacitive electret or condenser transducer elements of a miniature ECMs which exhibit extremely large generator impedances, essentially corresponding to a capacitor with a value between 0.5 and 2 pF. To support these types of extremely high impedance microphone transducer elements, the audio amplification circuit preferably posses an input impedance, at the input terminal, which is larger than 100 MΩ, preferably larger than 1 GΩ, even more preferably larger than 10 GΩ, measured at 1 kHz. In the alternative, the audio amplification circuit may be designed such that a capacitive component of the input impedance at the input terminal is smaller than 500 fF, preferably smaller than 200 fF, even more preferably smaller than 100 fF measured at 1 kHz. The input impedances or capacitances in the respective ranges outlined above can for example be accomplished by an appropriate choice of semiconductor process technology for the present amplification circuit for example by using MOS, CMOS or BiCMOS technology, and/or appropriate circuit design techniques. In one useful embodiment, which exhibits very large input impedance at the input terminal, respective input stages of the first and second preamplifiers are based on CMOS transistors.

The distortion compensation network compensates the second preamplifier for distortion generated by the non-linear element, coupled to the first input of the first preamplifier, at large levels of the audio input signal. At such large audio input signal levels, the input signal to first preamplifier is severely distorted due to the non-linearity of the the non-linear element. Ideally, the attenuated audio input signal applied to the first differential input of the second preamplifier should remain undistorted because the attenuator is linear and the attenuated audio input signal has a sufficiently low level to allow the second preamplifier and possible input protection circuitry to operate substantially linearly. Unfortunately, a portion of the distorted audio input signal at the first preamplifier is coupled to the second preamplifier by an unintended or parasitic signal path extending through the attenuator. This effect is particularly pronounced if the generator impedance of the audio source coupled to the input terminal is extremely large which the case for miniature ECMs as mentioned above. This unintended transmission of signal distortion through the parasitic path is basically caused by the extremely large impedance level of the capacitive transducer element of the miniature ECM or MEMS condenser microphone which prevents the capacitive transducer element in effectively controlling the input signal waveform at the input terminal supplying the audio input signal to the attenuator. The non-linear element may comprise a pair of anti-parallel bias diodes coupled between a non-inverting input, or an inverting input of the first preamplifier, and a DC reference voltage source. The DC reference voltage source sets an appropriate DC bias point of the first preamplifier. The pair of anti-parallel bias diodes may function as an extremely high impedance bias circuit with an impedance of 10 GΩ or larger for small signal operation of the first preamplifier. The extremely high impedance minimizes loading on the input terminal and therefore maximizes a level of the audio input signal delivered by the microphone transducer element to the first input of the first preamplifier. In addition, the non-linear element may advantageously provide overload protection or input signal limiting at the first input of the first preamplifier by limiting a peak signal input voltage to about predetermined value such as +/−0.5 Volt corresponding to a single forward diode drop of a diode of the pair of anti-parallel bias diodes. The skilled person will understand that each leg of the anti-parallel bias diodes may comprise a single or plurality of series coupled diodes such that the peak signal input voltage where signal limiting is activated can be increased to a desired level above the previously mentioned level of +/−0.5 Volt peak. In addition to the non-linear element which provides overload protection or signal clamping at the input of the first preamplifier, a corresponding non-linear element may be connected to the second differential input of the second preamplifier for the same purpose.

According to one embodiment of the invention, the distortion compensation signal is supplied through a compensation capacitance coupled between the first input of the first preamplifier and the second differential input of the second preamplifier. The distortion compensation network may comprise a first buffer coupled between the input terminal and the first input of the first preamplifier. The first buffer may comprise a unity gain buffer containing one or more active semiconductor device(s) such as MOS transistors. The first buffer has a large input impedance such as above 1 GΩ and a much lower output impedance such as below 10 kΩ and therefore operative to isolate the audio input signal at the input terminal from any loading from an input impedance of the first preamplifier. In one embodiment, the first buffer comprises a source follower coupled MOS transistor with a gate terminal operatively coupled to the input terminal and a source terminal operatively coupled to the first input of the first preamplifier. Consequently, the first buffer provides greater flexibility in the circuit designer's choice of circuit topology of the first preamplifier. The first preamplifier may comprise a differential amplifier and the first input thereof may be an inverting input or a non-inverting input thereof.

According to preferred embodiment of the invention, a coupling capacitor is connected between the input terminal and the non-linear element to provide a high-pass filtered audio input signal to the first preamplifier. The coupling or blocking capacitor may act as a DC blocking filter or a high-pass filter to remove DC components from the audio input signal before being applied to the first input of the first preamplifier. In addition, by appropriate selection of the value or capacitance of the coupling capacitor it may be adapted to reduce the amount of distortion coupled through the parasitic path for miniature microphones exhibiting the previously discussed range of extremely large capacitive generator impedances. In the latter embodiment, the capacitance of the coupling capacitor is preferably selected to a value close to the generator capacitance of the miniature microphone in question. This means that the coupling capacitor may have a value between 0.5 and 20 pF which is the typical range of equivalent generator capacitances of the capacitive transducer element of miniature condenser microphones.

According to yet another embodiment of the invention, the distortion compensation network comprises a second attenuator coupled to the non-linear element at an input of the first buffer to provide a second attenuated audio input signal. A second buffer is configured to coupling the second attenuated audio input signal to the second differential input of the second preamplifier through the compensation capacitance. Even though the audio input signals at the input and output of the first buffer theoretically are perfect replicas of each other, the skilled person will appreciate that any practical buffer design will add its own distortion contribution to the audio input signal at the buffer output, in particular for large audio input signal levels. Consequently, a difference in distortion signal characteristics may exist between the distortion signal supplied through from the non-linear element through the parasitic path and the distortion compensation signal supplied by the distortion compensation network derived from the buffer output leading to less than perfect suppression of the distortion signal at the output of the second preamplifier. This problem is circumvented in accordance with the present embodiment where the distortion compensation signal is derived from the input of the first buffer (instead of the buffer output) which is directly coupled to the non-linear element such that any distortion contribution from non-linearity of the first buffer itself is circumvented. Due to the signal attenuation of the attenuator, the amplitude or level of the second attenuated audio input signal supplied to the second buffer is lowered. The second buffer will accordingly be able to operate substantially linearly even when the audio input signal at the input of the first buffer is of very high level and therefore distorted due to the action of the non-linear element. The distortion compensation signal present at the output of the second buffer, and supplied to the second differential input of the second preamplifier through the compensation capacitance, will accordingly be an undistorted or accurate version of the distorted audio input signal at the input of the first buffer.

The feedback network of the second preamplifier may comprise a feedback capacitor coupled between the second differential input and a first output of the second preamplifier and an input capacitor coupled between the second differential input and a DC reference voltage. The distortion compensation signal is preferably coupled to an input terminal of the second preamplifier which input terminal is coupled between the feedback capacitor and the input capacitor. This allows the level of the distortion compensation signal supplied to the second preamplifier to be adjusted or tuned in a convenient manner by adjusting the capacitance of the compensation capacitor.

In a preferred embodiment of the audio amplification circuit, the second preamplifier and the first preamplifier have substantially identical small signal transfer functions throughout a frequency range between 100 Hz and 10 kHz. In this embodiment, a difference between first and second signal amplifications, determined from the input terminal to respective preamplifier outputs of the first and second preamplifiers, may be created exclusively by the attenuator. This has the advantageous effect that the first and second preamplifiers may be of substantially identical design or topology which facilitates matching of the small signal transfer functions through semiconductor process variations and operation temperature variations. The essentially identical small signal transfer functions of the first and second preamplifiers also benefit phase matching of the respective preamplifier output signals. In one such embodiment, a phase difference between respective small signal transfer functions of the first and second preamplifiers is less than:

15 degrees at 1 kHz, or 5 degrees, at 100Hz.

As explained in further detail below, there are certain advantages associated with providing simultaneous zero-crossings of the first and second output signals in connection with a level-dependent signal switching scheme between first and second digital audio signals derived from the first and second preamplifier output signals, respectively. In alternative embodiments, the difference between the first and second signal amplifications may be created by a combination of the audio signal attenuation of the attenuator and a gain difference between the first and second preamplifiers. The second preamplifier may function as a unity gain buffer or as an amplifier with a considerable gain for example more than 10 dB or more than 20 dB, throughout at least a portion of the audio frequency range such as between 300 Hz and 3 kHz In another preferred embodiment of the audio amplification circuit, a gain or amplification of the small signal transfer function of the first preamplifier is controlled by a capacitor ratio and/or a gain or amplification of the small signal transfer function of the second preamplifier is controlled by a capacitor ratio. In the present context, the gain or amplification means the audio frequency gain or amplification. The gain or amplification is preferably defined at 1 kHz. In one such embodiment, the audio frequency gain of each of the first and second preamplifiers is controlled by a capacitance ratio between a feedback capacitor coupled between the preamplifier output and an inverting input thereof. An input capacitor is coupled from the audio input to the inverting input of the first preamplifier. The audio frequency amplification of second preamplifier is preferably controlled in a corresponding manner by another capacitance ratio which may be identical to the capacitance ratio of the first preamplifier. These gain controlling capacitors are preferably all pF-sized capacitors, e.g. each having a capacitance smaller than 500 pF. Each of the capacitors may comprise a poly-poly capacitor or a MIM capacitor to achieve accurate setting of the respective gains of first and second preamplifiers. In addition, the use of poly-poly capacitors or MIM capacitors as input and feedback capacitors enhances small signal transfer function matching between the first and second preamplifiers due to the accurate control of capacitor ratios offered by such devices in semiconductor process technology.

In another embodiment of the audio amplification circuit a high-pass corner frequency of the small signal transfer function of the first preamplifier is controlled by a switched capacitor resistance and/or a high-pass corner frequency of the small signal transfer function of the second preamplifier is controlled by a switched capacitor resistance. The switched capacitor resistance may be coupled in parallel with the feedback capacitor. The use of the switched capacitor resistance allows adjustment of the high-pass corner frequency by adjusting a clock frequency of the switched capacitor resistance such that the high-pass corner frequency of the first and/or second preamplifier can be accurately controlled and also modified in an efficient manner by a simple change of clock frequency. Consequently, the high-pass corner frequency can be adapted to a particular application of the audio amplification circuit such as characteristics of a particular microphone element or to characteristics of down-stream signal processing circuits in a convenient manner.

In a number of useful embodiments, the first preamplifier and/or the second preamplifier comprises a differential amplifier. The first preamplifier and/or the second preamplifier may have a single-ended output or a differential output. In one embodiment, each of the first and second preamplifiers is coupled in a non-inverting configuration such that the non-inverting input is operatively coupled for receipt of the audio input signal. A feedback network may be coupled between an output and respective inverting inputs of the first and second preamplifiers. This preamplifier configuration provides large input impedance at the non-inverting input coupled to the audio input signal by isolating the feedback network there from. In an even further advantageous embodiment, the feedback network establishes a lowpass transfer function from the output of the differential amplifier to the inverting input of the first or the second preamplifier. This may be accomplished by selecting a suitable configuration of capacitors and resistive components in the feedback network. Consequently, a high-pass small signal transfer function which is useful for attenuating low-frequency noise in the audio input signal and for suppression of effects of DC offsets at the input of the first or second preamplifier is provided. To facilitate integration on a semiconductor substrate, resistive components of the feedback network may comprise MOS transistors operating or biased in their respective triode regions.

Another aspect of the invention relates to semiconductor die or substrate comprising an audio amplification circuit according to any of the above described embodiments thereof. The semiconductor die is preferably fabricated in a sub-micron CMOS semiconductor process to allow large scale manufacturing of the audio signal amplification circuit at very low costs.

The audio amplification circuit may advantageously comprise an overload protection or signal limiting feature coupled to the input pad or terminal. This feature protects both active and passive components, such as input transistors and attenuator components like resistors and capacitors, on the integrated semiconductor circuit against overvoltage conditions. Overvoltage conditions may lead to destruction or malfunctioning of the active or passive components due to excessive substrate currents. According to a preferred embodiment, the integrated semiconductor circuit comprises two or more cascaded non-linear elements, such as diodes or diode-coupled transistors, operatively coupled between the input terminal and at least one of {a DC power supply rail, a DC reference voltage} to clamp the audio input signal at a first limiting level. The DC power supply rail may comprise a positive or negative DC power supply voltage or ground (GND). The DC reference voltage may comprise a regulated DC voltage or bandgap derived DC voltage any other reasonably well-defined and stable DC voltage of the integrated semiconductor circuit. The first limiting level may be set to a numerical value of between about 1.0 Volt and 2.5 Volt for example by using between two and five cascaded diodes or diode-coupled transistors as the non-linear elements. One embodiment utilizes two sets or strings of non-linear elements mounted in anti-parallel configuration where each set comprises two or more cascaded non-linear elements. In this embodiment, the two sets of anti-parallel non-linear elements set both the first limiting level and a second limiting level. By appropriate selection of number and type of the cascaded non-linear elements the audio input signal can be clamped at two differing limiting levels for example a first limiting level between 1.0 Volt and 2.5 Volt above a quiescent or DC bias voltage at the input terminal and second limiting level between 1.0 Volt and 2.5 Volt below said quiescent or DC bias voltage at the input terminal.

Another aspect of the invention relates to a miniature capacitive or condenser microphone comprising a capacitive transducer element responsive to impinging sound to generate a corresponding transducer signal on a transducer signal terminal. The above-mentioned semiconductor die or substrate is operatively coupled to the transducer signal terminal via the input terminal of the semiconductor die for receipt and amplification of the transducer signal. The miniature capacitive microphone may be formed by an ECM or a microelectromechanical (MEMS) condenser microphone shaped and sized for mobile terminal applications.

Yet another aspect of the invention relates to a method of compensating an audio amplification circuit for distortion of a non-linear element, comprising steps of:
  deriving an audio input signal for a first input of a first preamplifier from an input signal of the audio amplification circuit,
  limiting the audio input signal at large levels by a non-linear element to supply a distorted audio input signal at the first input of the first preamplifier,
  attenuating the input signal by an attenuator,
  applying an attenuated audio input signal to a first differential input of a second preamplifier via an output of the attenuator,
  coupling a distortion compensation signal from the first input of the first preamplifier to a second differential input of the second differential preamplifier such that distortion in the output signal of the second preamplifier is cancelled or attenuated.

BRIEF DESCRIPTION OF THE DRAWINGS

Embodiments of the invention will be described in more detail in connection with the append drawings in which.

DESCRIPTION OF PREFERRED EMBODIMENTS

Figure 1:
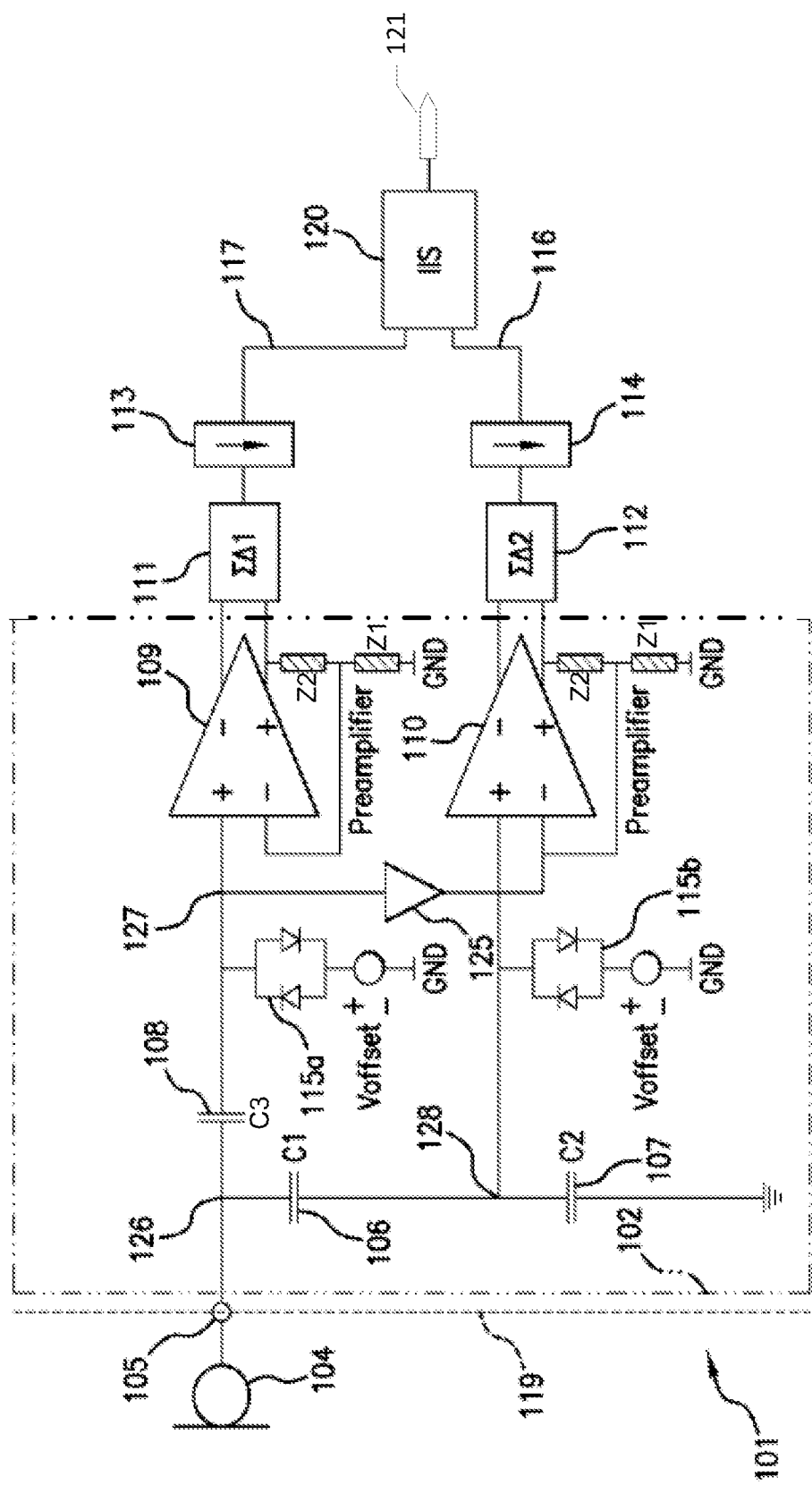
FIG. 1 is a schematic circuit diagram of an audio amplification circuit and system according to a first embodiment of the invention.

FIG. 1 is a schematic drawing of an audio amplification system 101 which comprises a microphone 104 operatively coupled to an audio amplification circuit 102 according to a first embodiment thereof. The audio amplification system 101 may serve as amplifying and digitizing front-end of a subsequent DSP based audio signal processing circuit (not shown). The audio amplification circuit 102 is configured to supply first and second analog output signals with different input referred overload points to enhance the dynamic range handling capability of the audio amplification system 101. The audio amplification circuit 102 may either be fabricated or implemented on separate CMOS semiconductor die or it may be fabricated on a CMOS semiconductor die together with first and second analogue-to-digital converters 111, 112 coupled to a digital audio interface 120. A separate DSP based audio signal processing circuit may reside remotely for example within a portable terminal in form of an appropriately programmed or configured Digital Signal Processor (DSP) with data interface terminal(s) operatively coupled to the illustrated externally accessible output terminal 121 of the present audio amplification system 101 for receipt of a digital audio signal or digital audio stream. In this configuration, the audio amplification circuit 102 may reside on a printed circuit board or other carrier of the portable terminal or alternatively be mounted within a miniature microphone housing of a microphone of the portable terminal. The audio amplification circuit 102 is therefore preferably shaped and sized for integration into the miniature microphone housing. In the illustrated embodiment, the audio amplification circuit 102 is connected to a miniature capacitive or condenser microphone 104 through an input terminal or pad 105 of the amplification circuit 102 via conventional wire bonding techniques. It will be appreciated that the audio amplification circuit 102 may be connected to and optionally sized and shaped for integration of a housing of a variety of different types of microphones, e.g. different types of miniature capacitive microphones. The amplification circuit 102 comprises first and second preamplifiers 109, 110, respectively, which in this embodiment are implemented as non-inverting operational amplifiers, each having an audio frequency amplification controlled by an impedance ratio of two impedances Z1 and Z2. The impedances Z1 and Z2 may comprise respective resistors or capacitors setting the respective audio band voltage gains or amplifications of the first and second preamplifiers 109, 110, respectively.

The first and second preamplifiers 109, 110, respectively, form part of an upper and lower signal path or channel operatively coupled to a common analogue audio input signal through input terminal 105. The first and second preamplifiers 109, 110, respectively, preferably exhibit essentially identical small signal transfer functions across a predetermined frequency range of the audio spectrum for example between 100 Hz and 10 kHz or between 300 Hz and 3 kHz. In this manner the difference between voltage or current gains determined from the audio input signal at input terminal 105 to the respective differential output voltages of the first and second preamplifiers is only caused by action of a capacitive voltage divider formed by capacitors C1 106 and C2 107.

The upper signal path comprises a DC blocking filter formed by a coupling capacitor C3 108 operative to remove DC components from the input signal before being applied to a non-inverting input of the first preamplifier 109. In the present embodiment the capacitance of the DC blocking or coupling capacitor C3 is preferably selected to a value equal to a capacitance of the miniature capacitive or condenser microphone 104 which typically lies between 1 and 20 pF, more preferably about 2 pF. The coupling capacitor C3 is coupled between the input terminal 105 and a non-linear element comprising a first pair of anti-parallel bias diodes 115a. The lower signal path comprises two capacitors C1 106 and C2 107, coupled as a capacitive voltage divider of the audio input signal. The function of the voltage divider, is to attenuate the audio input signal to the preamplifier 110 of the lower signal path, by a factor given by $V_{audio}=V_{mic} C_1/(C_2+C_1)$ where $V_{audio}$ is the audio input signal to the non-inverting input of the second or lower path preamplifier 110 and $V_{mic}$ is the input signal on node 126 generated by a microphone transducer element of the miniature microphone 104. The capacitive voltage divider comprising C1 106 and C2 107 is accordingly connected in-between the input terminal 105 and the non-inverting input of the second preamplifier 110. Sizes of the capacitances C1 and C2 are generally adapted to a generator impedance of the audio source supplying audio input signals through the input terminal 105. In the present embodiment, where the audio source is a miniature condenser microphone 104, the value of C1 preferably lies in a range between 20 and 100 fF (1 fF=$10^{-15}$ F). Preferably, C2 is between 2 and 20 times larger than C1, more preferably about 9 times larger, resulting in approximately 20 dB of signal attenuation of the input signal to the second preamplifier 110. In this manner, the overload point or voltage at the output of the second preamplifier 110 may be approximately 20 dB higher than the overload point or voltage at the output of the first preamplifier 109.

The first pair of anti-parallel bias diodes 115a is coupled between a non-inverting input terminal of the first preamplifier 109 and a DC reference voltage source $V_{offset}$ to set an appropriate DC bias point of the first preamplifier 109. The pair of anti-parallel bias diodes 115a functions as an extremely high impedance bias circuit with an impedance of 10 GΩ or larger for small signal operation of the first preamplifier 109. The extremely high impedance minimizes loading on the input terminal 105 and therefore maximizes a level of the audio input signal delivered by the microphone transducer element to the non-inverting input of the first preamplifier 109. In addition the pair of anti-parallel bias diodes 115a functions as overload protection or signal limiting for the non-inverting input terminal of the first preamplifier A1 by limiting a peak signal input voltage to about +/−0.5 Volt which corresponds to one diode voltage drop over a single forward diode of the pair of anti-parallel bias diodes 115a. A similar pair of anti-parallel bias diodes 115b is coupled between a non-inverting input terminal of the second preamplifier 110 and the DC reference voltage source $V_{offset}$. Finally, a third set of anti-parallel diodes (not shown) may be coupled between the input terminal 105 of the audio amplification circuit 102 and a positive DC power supply voltage or rail VDD. Each leg of the third set of anti-parallel diodes may comprise a cascade of two, or optionally more, diodes and operates to limit a peak signal input voltage to the audio amplification system to about +/−1.0 Volt (or higher if more diodes are cascaded in each leg) which corresponds to two diode voltage drops across forward-conducing diodes.

Each of the upper, or normal sensitivity signal path, and lower, or low sensitivity signal path, of the amplification circuit 102 optionally comprises a sigma-delta analogue-to-digital converter 111 and 112, respectively, for converting analogue output signals provided at respective differential outputs of the first and second preamplifiers 109, 110 into corresponding first and second digital audio signals. The first and second digital audio signals are transmitted to respective decimation filters 113, 114. In one embodiment, the first and second sigma-delta analogue-to-digital converters 111 and 112, respectively, are both single-bit converters operating at an oversampled sampling rate or frequency of 2.4 MHz. In the present embodiment, each decimation filter receives a one-bit digital audio stream at the oversampled sampling rate of 2.4 MHz and down-samples this single-bit audio stream to form a decimated and lowpass filtered digital audio signal with a word length of 16 bits at a 48 kHz final sampling frequency. However the skilled person will understand that a wide range of oversampled sampling frequencies, such as between 1.0 MHz and 10 MHz, and final sampling frequencies such as between 8 kHz and 96 kHz may be used by suitable adaptation of the illustrated embodiment in accordance with requirements of a particular application. The decimated and lowpass filtered digital audio signals are transmitted by respective data busses 116, 117 to the digital audio interface 120 operatively coupled in-between the first and second digital audio signals and the externally accessible output terminal 121. The digital audio interface 120 is configured to receive and convert the first and second digital audio signals at the 16 kHz final or Nyquist sampling rate into a digital audio stream compliant with a standardized data communication/digital audio protocol such as I²S, S/PDIF, AES/EBU, SLIMbus™. A signal selection circuit (not shown) may comprise a corresponding digital audio interface (not shown) for receipt and decoding of the digital audio stream. The signal selection circuit may additionally comprise logic and arithmetic circuitry configured for selectively conveying or transmitting one of the first and second digital audio signals based on a level, or other signal features, of the second digital audio signal. The signal selection circuit preferably comprises a software programmed microprocessor or DSP which implements functionality of the signal controller 122 by an appropriate collection of executable program instructions or subroutines. The audio amplification system 101 may be powered from a positive DC power supply voltage or rail. GND level acts as a negative DC power supply voltage or rail for the audio amplification system 101. In the present embodiment of the invention, the audio amplification system 101 is designed for operation on DC power supply voltages between 1.2 Volt and 2.0 Volt such as about 1.8 Volt. The audio amplification system 101 preferably comprises a clock input terminal (not shown) for receipt of, and synchronization to, an externally generated system clock to allow the first and second digital audio signals transmitted from the digital audio interface 120 to be synchronized to the externally generated system clock. The present audio amplification circuit 102 comprises a distortion compensation network comprising a non-inverting gain buffer 125 coupled between a non-inverting input 127 of the first preamplifier 109 and an inverting input of the second preamplifier 110. The gain of the non-inverting gain buffer 125 may be smaller than one, equal to one, or larger than one depending on the amount of input signal attenuation provided by the capacitive voltage divider. In the present embodiment, the gain of the non-inverting gain buffer 125 is smaller than one due to the attenuation of about 20 dB of the input signal to the second preamplifier 110. The non-inverting gain buffer 125 may comprise active devices forming a unity-gain buffer or amplifier with large input impedance and small output impedance to reduce loading of the non-inverting input 127 of the first preamplifier 109. The non-inverting gain buffer 125 reduces signal distortion at the differential output of the preamplifier 110 of the lower signal path or channel at large input signal levels of the audio input signal. At such large input signal levels, the input signal on preamplifier 109 of the upper signal path may be severely distorted due to non-linearity of the pair of anti-parallel diodes 115a. The distorted audio input signal at the first preamplifier 109 is coupled to the non-inverting input of the second preamplifier 110 by a unintended or parasitic signal path extending through coupling capacitor C3 and the capacitive voltage divider capacitors C1 and C2. In addition, a capacitance of the miniature capacitive or condenser microphone 104 also affects how much of the distorted audio input signal that is coupled to the non-inverting input of the second preamplifier 110 due to the capacitive voltage division at node 126. This unintended spill over effect of distortion to the non-inverting input of the preamplifier 110 is basically caused by a large impedance level of the capacitive transducer element of the miniature capacitive or condenser microphone 104 which prevents the latter in effectively controlling the input signal waveform at node 126. This unintended spill over effect of distortion is compensated by supplying a carefully adjusted corresponding amount of distortion to the inverting input of the second preamplifier 110 from the non-inverting input of the first preamplifier 109 through the non-inverting gain buffer 125. By adjusting the gain or attenuation of the gain buffer 125 such that substantially equal distortion signals are applied simultaneously to the non-inverting and inverting inputs of the second preamplifier 110, distortion in the differential output signal of the preamplifier 110 is substantially cancelled, or at least significantly attenuated, due to the differential amplification property of the second preamplifier 110.

Figure 2:
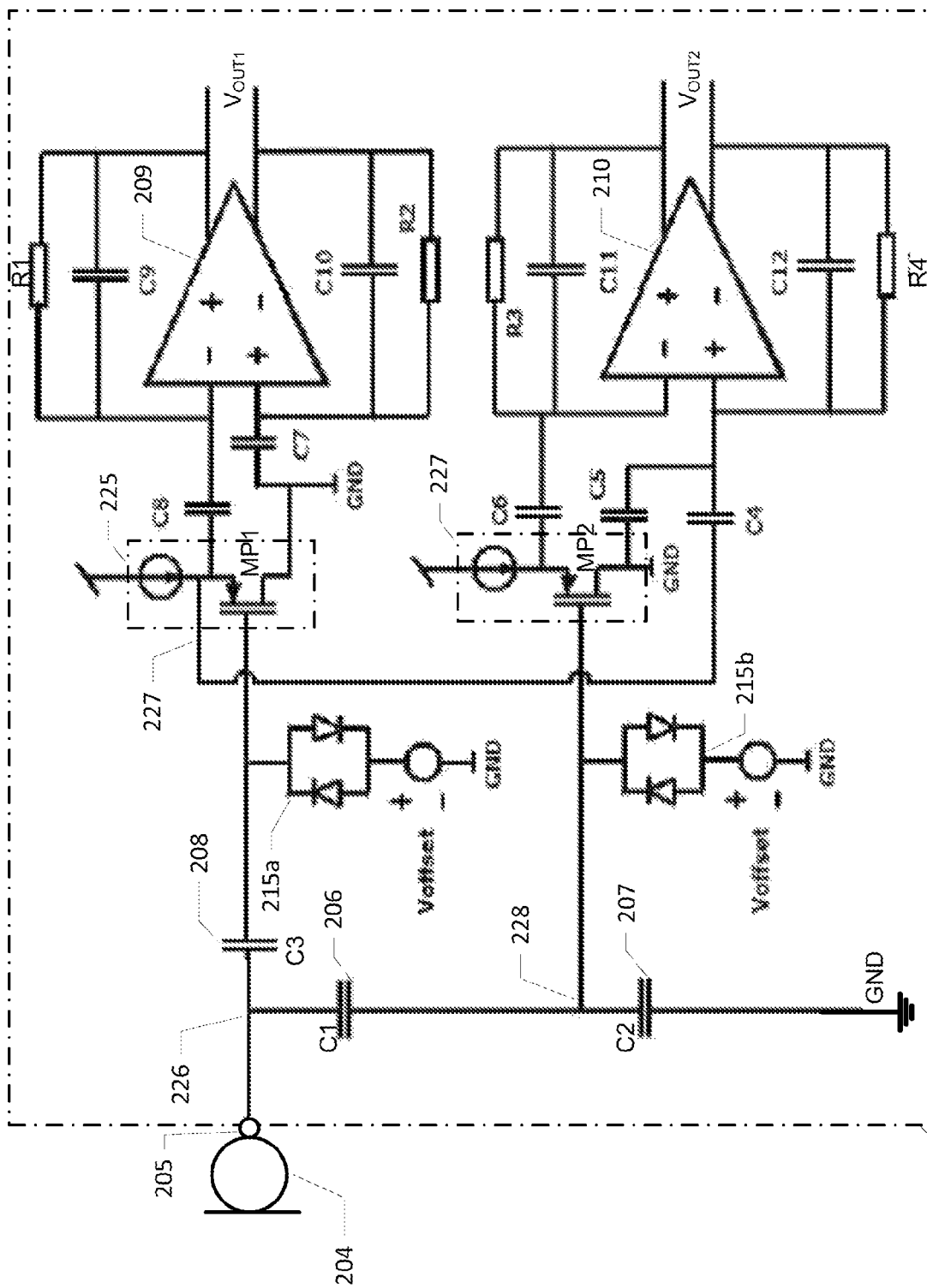
FIG. 2 is a schematic circuit diagram of an audio amplification circuit according to a second embodiment of the invention.

FIG. 2 is a schematic drawing of an audio amplification circuit 202 according to a second embodiment of the invention. Corresponding features, elements and components of the first and second embodiments of the audio amplification circuits, 102, 202, respectively, may have identical electrical characteristics such as capacitance, resistance, amplification etc. These corresponding elements have been provided with corresponding reference numerals to ease comparison. The audio amplification circuit 202 may be shaped and sized for integration into a miniature microphone housing for example being mounted on a printed circuit board or other carrier within a miniature microphone housing. In the illustrated embodiment, the audio amplification circuit 202 is connected to a miniature capacitive or condenser microphone 204 through an input terminal or pad 205 of the amplification circuit 202 via conventional wire bonding or flip-chip connection techniques. The audio amplification circuit 202 may be powered from a positive DC power supply voltage or rail and the GND terminal or level act as a negative DC power supply voltage or rail. In the present embodiment of the invention, the audio amplification circuit 202 is designed for operation on DC power supply voltages between 1.2 Volt and 2.0 Volt such as about 1.8 Volt The amplification circuit 202 comprises first and second preamplifiers 209, 210, respectively, which in this embodiment are implemented as respective inverting operational amplifiers with differential output signals at $V_{OUT1}$ and $V_{OUT2}$. The audio frequency amplification or gain of each of the first and second preamplifiers 209, 210, respectively, is controlled by a capacitor ratio throughout the audio frequency range. The audio frequency amplification or gain of first preamplifier 209 is controlled by a capacitance ratio between a feedback capacitor C9 and an input capacitor C8. The audio frequency amplification of second preamplifier 210 is controlled by a capacitance ratio between a feedback capacitor C11 and an input capacitor C6. These gain setting capacitors C9, C8, C11 and C6 are preferably all pF-sized capacitors, e.g. each having a capacitance smaller than 500 pF, and each preferably comprises a poly-poly capacitor or a MIM capacitor for accurate setting of the respective gains of first and second preamplifiers. In one exemplary embodiment of the invention, the capacitor values listed in Table 1 below were selected for the capacitors:

TABLE 1

| | |
|---|---|
| C1 | 0.130 pF |
| C2 | 1.2 pF |
| C3 | 2 pF |
| C4 | 1.6 pF |
| C5 | 48.4 pF |
| C6 | 48.4 pF |
| C7 | 48.4 pF |
| C8 | 48.4 pF |
| C9 | 6 pF |
| C10 | 6 pF |
| C11 | 8 pF |
| C12 | 8 pF |

These values are advantageous to minimize semiconductor substrate area consumption of the first and second preamplifier. In the present embodiment, a differential gain at 1 kHz of the first preamplifier 209, measured as the ratio between the single-ended audio input signal at the input of C8 and the differential output signal $V_{OUT1}$ may be set to a value between 12 dB and 30 dB such around 18 dB. The differential gain at 1 kHz of the second preamplifier 210 may be substantially identical or different when measured in a corresponding manner.

A high-pass corner frequency of a small signal transfer function of the first preamplifier 209 is controlled by the value of resistors R1 and R2. Each of the resistors R1, R2 preferably comprises a switched capacitor resistance. The use of the switched capacitor resistance allows adjustment of the high-pass corner frequency by adjusting a clock frequency of the switched capacitor resistance such that the high-pass corner frequency of the first preamplifier 209 can both be accurately controlled and modified in an efficient manner by a simple change of clock frequency. A high-pass corner frequency of a small signal transfer function of the second preamplifier 210 is controlled by the value of switched capacitor resistances R3 and R4 in a corresponding manner. Consequently, the high-pass corner frequencies can be adapted to a particular application such as characteristics of a particular microphone element or to characteristics of down-stream signal processing circuits in a convenient manner.

The first and second preamplifiers 209, 210, respectively, form an upper and lower signal path or channel operatively coupled to an audio input signal through the input terminal 205. The upper signal path comprises a DC blocking filter formed by blocking or coupling capacitor C3 (208) operative to remove DC components from the input signal before being applied to an inverting input of the first preamplifier 209 through a unity-gain buffer 225. In the present embodiment the capacitance of the blocking capacitor C3 is preferably selected to a value close to a generator capacitance of the miniature capacitive or condenser microphone 204 which generator capacitance typically lies between 1 and 20 pF such as about 2 pF which leads to the listed value of C1 in Table 1 above. The blocking capacitor C3 is coupled between the between the input terminal 205 and a non-linear element comprising a first pair of anti-parallel bias diodes 215a, preferably implemented as a pair of diode-coupled PMOS transistors. The unity gain buffer 225 comprises a source-follower coupled PMOS transistor with its gate terminal coupled to the audio input signal and a source terminal coupled to the input side of the input capacitor C8 of the first preamplifier 209. The unity gain buffer 225 serves several purposes in that it is operative to isolate the audio input signal from loading by an input impedance at the input of the first preamplifier 209 through C8. The unity gain buffer 225 also forms part of a distortion compensation network of the amplification circuit 202 where it supplies a distortion compensation signal from the first input of the first preamplifier, which is located at the source terminal of the PMOS transistor MP1, to a non-inverting input of the second preamplifier 210 through compensation capacitor C4 as described in further detail below.

The lower signal path comprises two series coupled capacitors C1 206 and C2 207, configured as a capacitive voltage divider of the audio input signal. The function of the voltage divider, is to attenuate the audio input signal to the second preamplifier 210 of the lower signal path, by a factor given by $V_{audio}=V_{mic} C_1/(C_2+C_1)$ where $V_{audio}$ is the attenuated audio input signal supplied at the attenuator output node 228 and $V_{mic}$ is the audio input signal on node 226 generated by the condenser transducer element of the miniature microphone 204. An attenuated audio input signal is supplied from the output node 228 of the capacitive attenuator to the inverting input of the second preamplifier 209 through a second unity gain buffer 227 similar in design to the previously described unity gain buffer. Sizes of the capacitances C1 and C2 are generally adapted to a generator impedance of the audio source supplying audio input signals through the input terminal 205. In the present embodiment, where the audio source is a miniature condenser microphone 204, such as the previously mentioned condenser microphone, the value of C1 is preferably in a range between 20 and 200 fF (1 fF=$10^{-15}$ F). Preferably C2 is 2-20 times larger than C1, more preferably about 9 times larger, resulting in approximately 20 dB of signal attenuation of the attenuated audio input signal supplied to the inverting input of the second preamplifier 210 through a series input capacitor C6.

The first pair of anti-parallel bias diodes 215a is coupled between a non-inverting input terminal of the first preamplifier 209 and a DC reference voltage source $V_{offset}$ to set an appropriate DC bias point of the first preamplifier 209. The first pair of anti-parallel bias diodes 215a functions as an extremely high impedance bias circuit with an impedance of 10 GΩ or larger for small signal operation of the first preamplifier 209. The extremely high impedance minimizes loading on the input terminal 205 and therefore maximizes a level of the audio input signal delivered by the microphone transducer element to the non-inverting input of the first preamplifier 209. In addition the pair of anti-parallel bias diodes 215a functions as overload protection or signal limiting for the inverting input terminal of the first preamplifier by limiting a peak signal input voltage to about +/−0.5 Volt which corresponds to one diode voltage drop over a single forward diode of the pair of anti-parallel bias diodes 215a. A similar pair of anti-parallel bias diodes 215b and DC reference voltage source $V_{offset}$ is coupled between the attenuator output and the input of a second unity gain buffer 227. Finally, a third set of anti-parallel diodes (not shown) may be coupled between the input terminal 205 of the audio amplification circuit 202 and a positive DC power supply voltage or rail. Each leg of the third set of anti-parallel diodes comprises a cascade of two, or optionally more, diodes and operates to limit a peak signal input voltage to the audio amplification system to about +/−1.0 Volt (or higher if more diodes are cascaded in each leg) which corresponds to two diode voltage drops across forward-conducing diodes.

The amplification circuit 202 comprises a distortion compensation network as previously mentioned. The role of the distortion compensation network is to attenuate or suppress signal distortion generated by the non-linearity of the pair of anti-parallel input protection diodes 215a at large input signal levels. When the level of the audio input signal at the input of the first preamplifier 209 exceeds a forward diode voltage drop, the input protection diodes enter a conducting state and introduce severe distortion in the audio input signal. The exact voltage of the forward diode voltage drop will vary according to size and type of diode but will typically lie between 0.5 and 0.8 Volt such level of the audio input signal is effectively clamped or limited at +/−0.5-0.8 Volt peak from the DC reference voltage source $V_{offset}$. The skilled person will however understand that each leg of the pair of anti-parallel input protection diodes 215a could comprise more a plurality of individual semiconductor diodes such as between 2 and 10 semiconductor diodes. The clamping or limiting voltage of the latter arrangement of anti-parallel input protection diodes will thereby increase in a corresponding manner from the above-mentioned +/−0.5-0.8 Volt peak such that larger input limiting voltages may be provided to fit characteristics of different types of miniature microphones and available DC power supply voltages. The distorted audio input signal at the input of the unity gain buffer 225 and therefore also at the inverting input of first preamplifier 209 is coupled to the inverting input of the second preamplifier 210 by an unintended or parasitic signal path extending through coupling capacitor C3 and the capacitive voltage divider as previously described in connection with the first embodiment of the invention. It should be noted that a capacitance of the transducer element of the miniature condenser microphone 204 and the value of the coupling capacitor C3 also affect how much of the distorted audio input signal that is coupled to the inverting input of the second preamplifier 210 due to the parasitic signal path as described before. The distorted audio input signal at the inverting input of the second preamplifier 210 is compensated by a distortion compensation signal supplied by the distortion compensation network. The distortion compensation network comprises the unity-gain buffer 225 and the compensation capacitor C4 and couples the distortion compensation signal from the inverting input of the first preamplifier 210, which is located at the source terminal of MP1, to a non-inverting input of the second preamplifier 210. The distortion compensation signal is accordingly applied to an opposite differential input of the second preamplifier 210 relative to the differential input where the attenuated audio input signal is applied. Consequently, by careful adjusting the level of distortion compensation signal to match the level of the distortion signal coupled through the parasitic path, the differential amplification function or mechanism of the second preamplifier 210 ensures that distortion in the differential output signal V$_{OUT2}$ is largely eliminated, or at least significantly supressed. The level of distortion compensation signal can be adjusted by careful selection of the capacitance of the compensation capacitor C4 relative to the capacitances of gain setting capacitors C12 and C5 which also are coupled to the non-inverting input of the second preamplifier 210.

The skilled person will appreciate that the present distortion compensation mechanism relies on the use of opposite polarity differential inputs or terminals of the preamplifier for receipt of respective ones of the distortion compensation signal and the distorted and attenuated audio input signal. Hence, the distortion cancellation or suppression mechanism works equally well for both inverting and non-inverting configurations of a differential amplifier. In one embodiment of the amplification circuit 202, the value of the capacitances C12 and C5 are set to 8 pF and 48.4 pF, respectively, in accordance with Table 1 above. The capacitance of C4 was set to 1.4 pF to provide maximum distortion suppression. In this embodiment capacitances C1, C2 and C3 were set to the values listed in Table 1.

Figure 3:
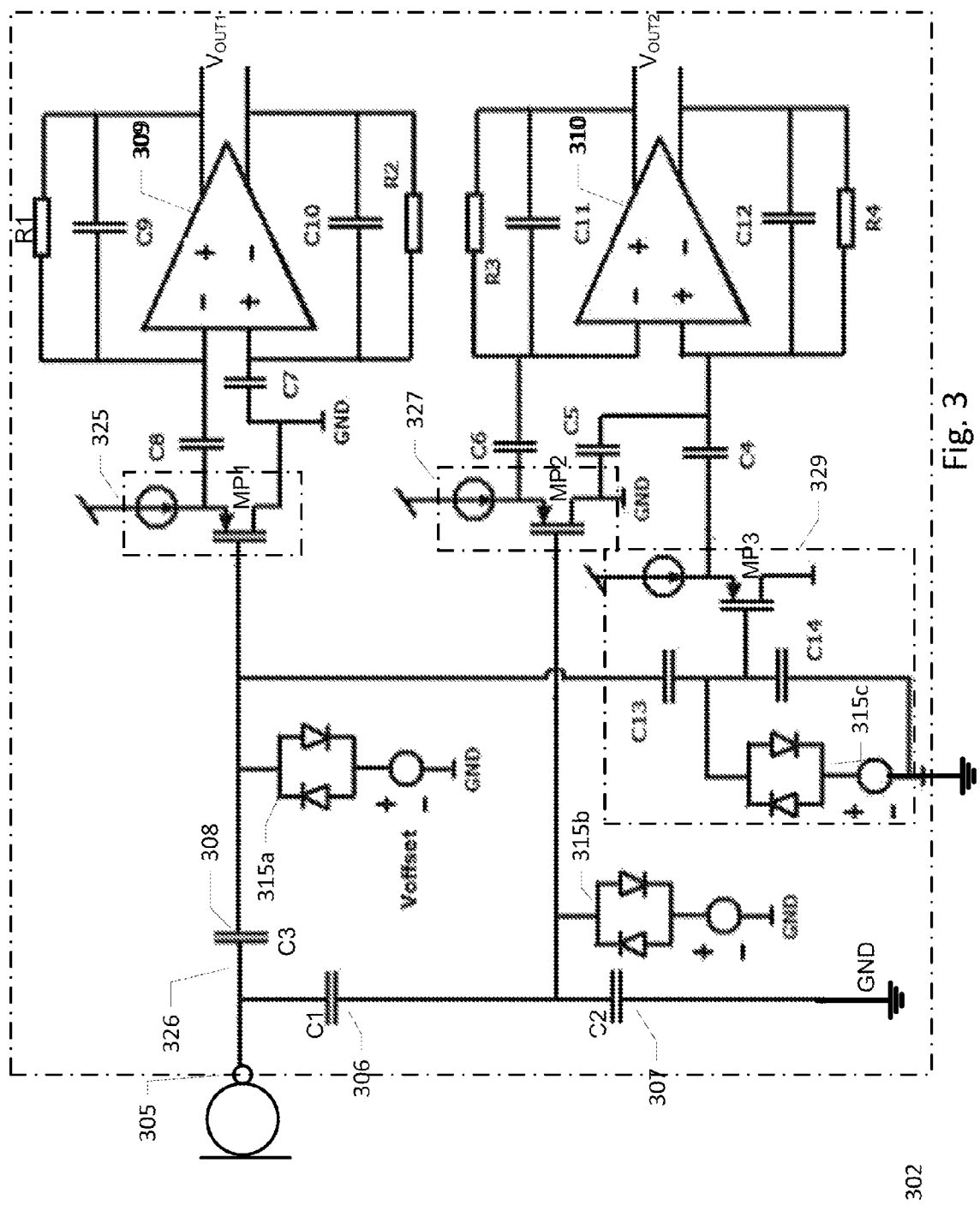
FIG. 3 is schematic circuit diagram of an audio amplification circuit according to a third embodiment of the invention.

FIG. 3 is a schematic drawing of an audio amplification circuit 302 according to a third embodiment of the invention. Corresponding features, elements and components of the second and third embodiments of the audio amplification circuits, 202, 302, respectively, may have identical electrical characteristics such as capacitance, resistance, amplification etc. The present audio amplification circuit 302 has been modified to improve distortion suppression performance compared to the distortion suppression offered by the above-discussed second embodiment of the invention. The present audio amplification circuit 302 comprises a modified or alternative distortion compensation network 329 which comprises capacitors C13 and C14 together with a unity-gain buffer build around PMOS transistor MP3. The alternative distortion compensation network 329 further comprises a third pair of anti-parallel bias diodes 315c coupled to a gate input of the PMOS transistor MP3. In the present distortion compensation network, the distorted audio input signal at the gate terminal of the source-followed connected PMOS transistor MP1 is used to derive the distortion compensation signal supplied by the distortion compensation network to the non-inverting input of the second preamplifier 310. This differs from the above-discussed second embodiment of the distortion compensation network where the distorted audio input signal was derived from the source terminal of the source-followed connected PMOS transistor MP1. Even though the audio input signals at the gate and source of the PMOS transistor MP1 theoretically are perfect replicas of each other, the skilled person will appreciate that in practice PMOS transistor MP1 will add its own distortion contribution to the audio input signal, in particular for large audio input signal levels where the compensation mechanism is most needed. Consequently, a difference in distortion signal characteristics may exist between the distortion signal supplied through the parasitic path and the distortion compensation signal supplied by the distortion compensation network leading to less than perfect suppression of the distortion signal at the output of the second preamplifier 210 in the second embodiment of the invention. This problem is circumvented in the present embodiment of the distortion compensation network 329 by deriving the distortion compensation signal from the gate terminal of the PMOS transistor MP1 which is directly coupled to the non-linear element, i.e. the first pair of anti-parallel bias diodes 315a, such that any distortion contribution from the PMOS transistor MP1 itself is circumvented. The distortion compensation signal is coupled from the gate terminal of the PMOS transistor MP1 and attenuated by a second capacitive voltage divider comprising the capacitors C13 and C14 wherein the output of the attenuator is supplied to the input of the third unity-gain buffer build around PMOS transistor MP3. Due to the attenuation in the second capacitive voltage divider, which lowers the signal amplitude, the output signal waveform at the source terminal of the PMOS transistor MP3 is a near perfect replica, i.e. undistorted, version of the distorted audio input signal at the input of the unity-gain buffer 325 even at large input signal levels. This undistorted version of the distorted audio input signal is thereafter applied to the non-inverting input of the second preamplifier 310 through a compensation capacitor C4. By careful adjustment of the capacitance of the compensation capacitor C4 the level of the distortion compensation signal will match the level of the distortion signal supplied to the inverting terminal of the second preamplifier 310 through the parasitic path and further through the second unity-gain buffer 327.

The invention claimed is:

1. An audio amplification circuit comprising:
    an input terminal for receipt of an audio input signal,
    an attenuator coupled to the input terminal for providing an attenuated audio input signal at an attenuator output,
    a first preamplifier comprising a first input operatively coupled to the input terminal for receipt of the audio input signal,
    a non-linear element coupled to the first input of the first preamplifier distorting the audio input signal at large levels,
    a second preamplifier comprising first and second differential inputs wherein a first differential input is operatively coupled to the attenuator output for receipt of the attenuated audio input signal and the second differential input is coupled to a feedback network, and
    a distortion compensation network adapted to supply a distortion compensation signal from the first input of the first preamplifier to the second differential input of the second preamplifier to reduce distortion in the output signal of the second preamplifier.

2. An audio amplification circuit according to claim 1, wherein the attenuator comprises a voltage divider.

3. An audio amplification circuit according to claim 1, wherein the distortion compensation network comprises:
    a compensation capacitance coupled between the first input of the first preamplifier and the second differential input of the second preamplifier.

4. An audio amplification circuit according to claim 3, wherein the distortion compensation network comprises:
    a first buffer coupled between the input terminal and the first input of the first preamplifier.

5. An audio amplification circuit according to claim 4, wherein the first buffer comprises a source follower coupled MOS transistor with a gate terminal operatively coupled to the input terminal and a source terminal operatively coupled to the first input of the first preamplifier.

6. An audio amplification circuit according to claim 1, comprising a coupling capacitor connected between the input terminal and the non-linear element to provide a high-pass filtered audio input signal to the first preamplifier.

7. An audio amplification circuit according to claim 6, wherein the distortion compensation network comprises:
    a second attenuator coupled to the non-linear element at an input of the first buffer to provide a second attenuated audio input signal, and
    a second buffer configured to coupling the second attenuated audio input signal to the second differential input of the second preamplifier through the compensation capacitance.

8. An audio amplification circuit according to claim 1, wherein the feedback network of the second preamplifier comprises:
- a feedback capacitor coupled between the second differential input and a first output of the second preamplifier, and
- an input capacitor coupled between the second differential input and a DC reference voltage.

9. An audio amplification circuit according to claim 1, wherein a capacitive component of an input impedance at the input terminal is smaller than 500 fF measured at 1 kHz.

10. An audio amplification circuit according to claim 1, wherein the non-linear element comprises a pair of anti-parallel bias diodes limiting the audio input signal at the first input of the first preamplifier.

11. An audio amplification circuit according to claim 1, wherein an input impedance at the input terminal is larger than 100 MΩ measured at 1 kHz.

12. An audio amplification circuit according to claim 1, wherein the second preamplifier and the first preamplifier have substantially identical small signal transfer functions throughout a frequency range between 100 Hz and 10 kHz.

13. An audio amplification circuit according to claim 1, wherein a phase difference between respective small signal transfer functions of the first and second preamplifiers is less than
- 15 degrees at 1 kHz
- at 100 Hz.

14. An audio amplification circuit according to claim 1, wherein a high-pass corner frequency of the small signal transfer function of the first preamplifier is controlled by a switched capacitor resistance.

15. An audio amplification circuit according to claim 14, wherein a gain of the small signal transfer function of the first preamplifier is controlled by a capacitor ratio.

16. An audio amplification circuit according to claim 1, comprising two or more cascaded non-linear elements operatively coupled between the input terminal and at least one of a DC power supply rail and a DC reference voltage to clamp the audio input signal at a first limiting level.

17. An audio amplification circuit according to claim 1, wherein the circuit is manufactured on a semiconductor substrate.

18. A miniature capacitive microphone comprising:
- a capacitive transducer element responsive to impinging sound to generate a corresponding transducer signal on a transducer signal terminal, and
- the audio amplification circuit according to claim 17 operatively coupled to the transducer signal terminal via the input terminal of the amplification circuit for receipt and amplification of the transducer signal.

19. A method of compensating an audio amplification circuit for distortion of a non-linear element, comprising steps of:
- deriving an audio input signal for a first input of a first preamplifier from an input signal of the audio amplification circuit,
- limiting the audio input signal at large levels by a non-linear element to supply a distorted audio input signal at the first input of the first preamplifier,
- attenuating the input signal by an attenuator,
- applying an attenuated audio input signal to a first differential input of a second preamplifier via an output of the attenuator, and
- coupling a distortion compensation signal from the first input of the first preamplifier to a second differential input of the second differential preamplifier to reduce distortion in the output signal of the second preamplifier.

20. An audio amplification circuit according to claim 2, wherein the voltage divider is capacitive.

21. An audio amplification circuit according to claim 2, wherein the voltage divider is resistive.

22. An audio amplification circuit according to claim 1, wherein a capacitive component of an input impedance at the input terminal is smaller than 200 fF measured at 1 kHz.

23. An audio amplification circuit according to claim 1, wherein a capacitive component of an input impedance at the input terminal is smaller than 100 fF measured at 1 kHz.

24. An audio amplification circuit according to claim 1, wherein an input impedance at the input terminal is larger than 1 GΩ measured at 1 kHz.

25. An audio amplification circuit according to claim 1, wherein an input impedance at the input terminal is larger than 10 GΩ measured at 1 kHz.

26. An audio amplification circuit according to claim 1, wherein a phase difference between respective small signal transfer functions of the first and second preamplifiers is less than 5 degrees at 100 Hz.

27. An audio amplification circuit according to claim 1, wherein a high-pass corner frequency of the small signal transfer function of the second preamplifier is controlled by a switched capacitor resistance.

28. An audio amplification circuit according to claim 27, wherein a gain of the small signal transfer function of the first preamplifier is controlled by a capacitor ratio.

29. An audio amplification circuit according to claim 27, wherein a gain of the small signal transfer function of the second preamplifier is controlled by a capacitor ratio.

30. An audio amplification circuit according to claim 14, wherein a gain of the small signal transfer function of the second preamplifier is controlled by a capacitor ratio.

* * * * *